United States Patent [19]
Gottshall et al.

[11] Patent Number: 5,903,173
[45] Date of Patent: May 11, 1999

[54] LOW SIDE DRIVER CIRCUIT WITH DIAGNOSTIC OUTPUT

[75] Inventors: Paul C. Gottshall, Washington; Long T. Le, Peoria, both of Ill.

[73] Assignee: Caterpillar Inc., Peoria, Ill.

[21] Appl. No.: 08/854,398

[22] Filed: May 12, 1997

[51] Int. Cl.$^6$ .................................................... H03K 3/00
[52] U.S. Cl. ........................... 327/108; 327/432; 327/434
[58] Field of Search .................................. 327/5, 40, 51, 327/52, 54, 63, 90, 108, 109, 110, 143, 198, 374–377, 379, 389, 391, 427, 431, 432, 434, 437, 440, 478, 483, 575, 576, 581, 541–543

[56] References Cited

U.S. PATENT DOCUMENTS

| | | | |
|---|---|---|---|
| Re. 35,041 | 9/1995 | Rossi et al. .............................. | 327/109 |
| 4,634,903 | 1/1987 | Montorfano ............................. | 327/379 |
| 5,434,527 | 7/1995 | Antone .................................... | 327/391 |
| 5,438,489 | 8/1995 | Judy et al. ............................... | 361/191 |
| 5,467,240 | 11/1995 | Williamson et al. ..................... | 361/18 |
| 5,534,814 | 7/1996 | Archer ..................................... | 327/427 |
| 5,546,043 | 8/1996 | Pollmeier ................................ | 327/427 |
| 5,646,561 | 7/1997 | Fanini et al. ............................. | 327/379 |

*Primary Examiner*—My-Trang Nu Ton
*Attorney, Agent, or Firm*—Mario J. Donato, Jr.

[57] ABSTRACT

A low side driver circuit includes a command voltage source, a first switching transistor having a base connected to the command voltage source, an emitter connected to ground, and a collector connected to a second switching transistor base. The second switching transistor includes an emitter connected to a first reference voltage. A power transistor includes a gate connected to the second switching transistor collector through a first resistor, a drain connected to an electrical energy source through a load, and a source connected to ground through a sense resistor. A second resistor is connected between the power transistor gate and ground. A diagnostic circuit portion including a first comparator and a second comparator establishes a diagnostic output voltage based upon the voltages at the power transistor drain, gate and source for indicating fault conditions of the driver circuit.

14 Claims, 1 Drawing Sheet

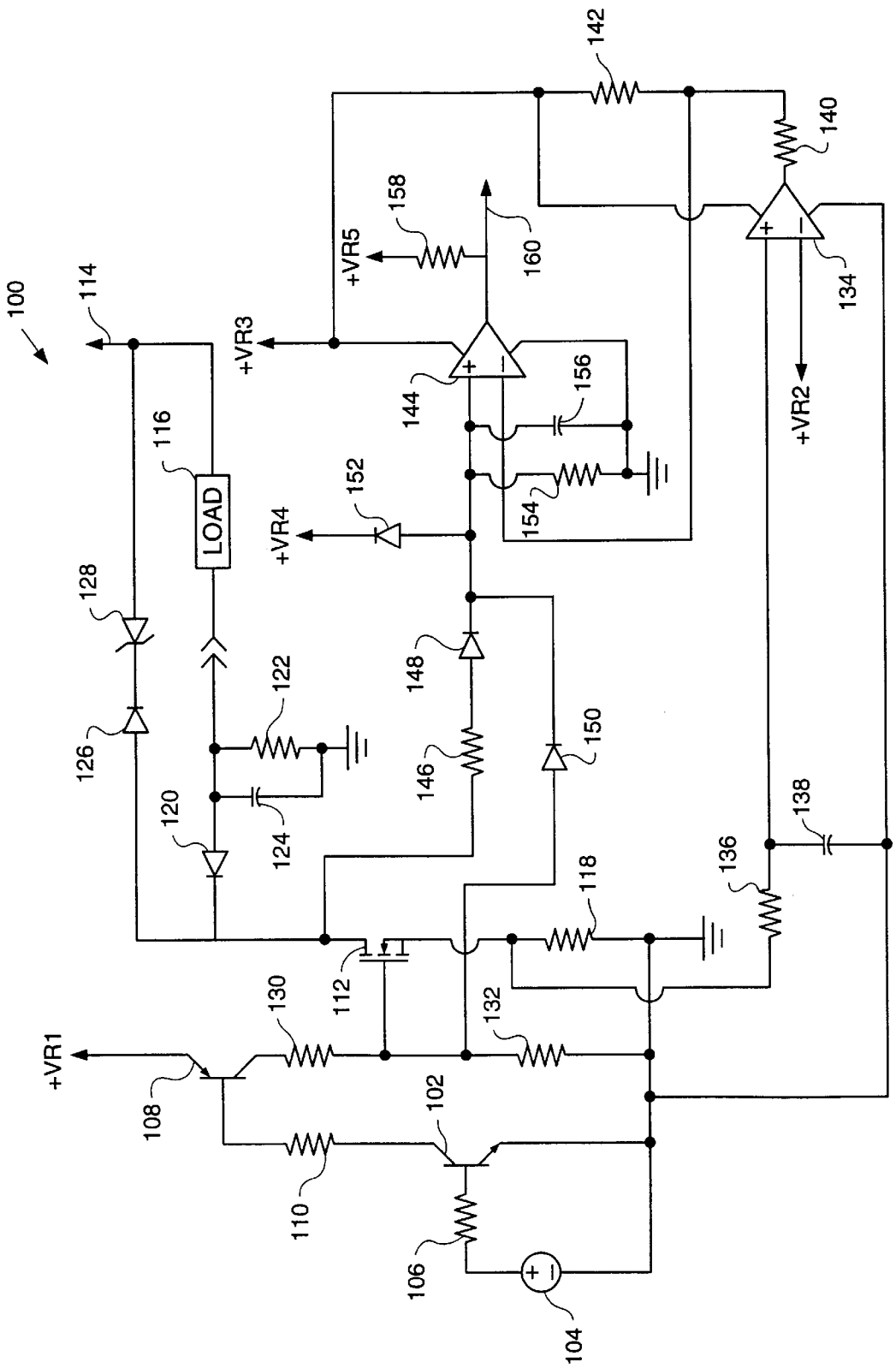

LOW SIDE DRIVER CIRCUIT WITH DIAGNOSTIC OUTPUT

TECHNICAL FIELD

This invention relates generally to a driver circuit and, more particularly, to a low side driver circuit, with a diagnostic output, for driving resistive and inductive loads having high current requirements.

BACKGROUND ART

Driver circuits using bipolar junction transistors have been used to drive electrical loads in the past. However, such bipolar junction transistor based driver circuits cannot effectively be used to drive loads requiring high currents of 2 amperes or more. Driver circuits capable of driving inductive and resistive loads with high currents are required in a variety of industrial applications, including electronically controlled heavy machinery. The term "low side" driver circuit is indicative of a circuit which drives a load by sinking a current through the load. It is also desirable to provide diagnostic output information from driver circuits, which diagnostic output information may be utilized by a digital controller. For example, such diagnostic output information is particularly desirable for detecting fault conditions such as a short circuit condition or an open circuit condition.

The present invention is directed to overcoming one or more of the problems as set forth above.

DISCLOSURE OF THE INVENTION

In one aspect of the present invention a driver circuit includes a command voltage source, a first switching transistor having a base connected to the command voltage source, an emitter connected to ground, and a collector connected to a second switching transistor base. The second switching transistor includes an emitter connected to a first reference voltage. A power transistor includes a gate connected to the second switching transistor collector through a first resistor, a drain connected to an electrical energy source through a load, and a source connected to ground through a sense resistor. A second resistor is connected between the power transistor gate and ground.

In another aspect of the present invention a driver circuit includes a power transistor having a drain connected to an electrical energy source through a load. A diagnostic portion of the driver circuit includes two comparators. A diagnostic output voltage is established at the output terminal of one of the comparators based upon the voltages at the power transistor drain, gate and source for detecting fault conditions of the driver circuit.

In another aspect of the present invention a method of detecting a fault condition of a driver circuit including a power transistor having a drain, a gate and a source involves determining if a current through the power transistor exceeds a predetermined level and establishing a voltage based upon the determination. Another voltage is established based upon either the power transistor drain voltage or the power transistor gate voltage.

The two established voltages are compared and a diagnostic output voltage is established based upon the comparison.

BRIEF DESCRIPTION OF DRAWINGS

For a better understanding of the present invention, reference may be made to the accompanying drawings in which:

FIG. 1 shows a low side driver circuit associated with a preferred embodiment of the present invention.

BEST MODE FOR CARRYING OUT THE INVENTION

Referring now to the drawings, wherein a preferred embodiment of the present invention is shown, FIG. 1 illustrates a low side driver circuit 100. An npn switching transistor 102 includes a base connected to a command voltage source 104 through a resistor 106, and an emitter connected to ground. A pnp switching transistor 108 includes a base connected to the npn switching transistor collector through a resistor 110 and an emitter connected to a positive reference voltage +VR1. Resistor 106 may be selected to ensure that npn transistor 102 is turned on hard in response to a positive command voltage, and resistor 110 may be selected to ensure that pnp transistor 108 operates at saturation when turned on.

A power transistor 112, such as an N-channel MOSFET, includes a gate, a drain connected to an electrical energy source 114 through a load 116, and a source connected to ground through a sense resistor 118. The electrical energy source may include a vehicle battery and the load may be resistive or inductive in nature. A diode 120 may also be connected between the load 116 and the power transistor drain for electrostatic discharge and reverse voltage protection. A resistor 122 may be provided having a first side connected between load 116 and diode 120 and a second side connected to ground for electrostatic paint protection, and a capacitor 124 may be connected in parallel with resistor 122 for electrostatic discharge protection and electromagnetic interference protection. Diode 126 and zener diode 128 may be included to clamp any transient spike voltage that might damage the power transistor 112.

A resistor 130 is connected between the pnp switching transistor collector and the power transistor gate and a resistor 132 is connected between the power transistor gate and ground. The pnp switching transistor 108, resistor 130 and resistor 132 are connected in series between the reference voltage +VR1 and ground, the resistors 130 and 132 being connected in series between the pnp switching transistor 108 and ground. Throughout this specification the state of the driver circuit 100 is referred to as on or off, on referring to the state when transistors 102, 108, and 112 are turned on, such on state of the driver circuit 100 being effected by a positive command voltage. The resistors 130 and 132 can be selected, in conjunction with the magnitude of reference voltage +VR1, to establish a predetermined on state gate voltage to the power transistor 112 in order to limit the current through power transistor 112 to a level which is less than the maximum current rating for such power transistor 112.

A diagnostic circuit portion includes a first comparator 134 having a positive input terminal connected between the power transistor source and the sense resistor 118. Such connection may be through a resistor 136 as shown, which in combination with a capacitor 138 may be utilized to filter transient voltage spikes from being applied to the positive input terminal of the comparator 134. Comparator 134 includes a negative input terminal connected to a positive reference voltage +VR2 and an output terminal connected through resistors 140 and 142 to a positive reference voltage +VR3.

A second comparator 144 includes a negative input terminal connected between resistors 140 and 142. Thus, the negative input terminal of comparator 144 is connected to the output terminal of comparator 134 through resistor 140. A positive input terminal of comparator 144 is connected to the power transistor drain through a resistor 146 and a diode 148, and is also connected to the power transistor gate through a diode 150. The positive input terminal of comparator 144 is further connected to a positive reference voltage +VR4 through a diode 152, the anode of diode 152 being connected to the positive input terminal of comparator 144 and the cathode being connected to the reference voltage +VR4. The positive input terminal of comparator 144 may also be connected to ground through a resistor 154 and a capacitor 156 arranged in parallel. Comparator 144 also includes an output terminal connected to a positive reference voltage +VR5 through a resistor 158, a diagnostic output 160 of the driver circuit 100 being provided at the output terminal of the comparator 144.

With respect to comparators 134 and 144, such comparators may be open collector type comparators having ground terminals connected to ground. Further, the reference voltage +VR3 may be the same voltage which is used to power the comparators 134 and 144 as shown.

INDUSTRIAL APPLICABILITY

The operation of the present invention is now described by way of example. Driver circuit 100 may be utilized, for example, to drive a solenoid having a resistance of 6 ohms with about 2 amperes of current from a +12 volt electrical energy source 114. Reference voltages +VR1 and +VR3 of +13 volts are also assumed.

When a positive command voltage is applied to the base of switching transistor 102, both switching transistor 102 and switching transistor 108 are switched on. The command voltage 104 might typically be provided from a digital controller or other logic means. Resistors 130 and 132 are selected such that when switching transistor 108 is switched on, power transistor 112 will also be turned on by the voltage applied to the gate. If identical resistance values are selected for resistors 130 and 132, the voltage applied to the power transistor gate will be about +6.4 volts, assuming a +0.2 volt drop across switching transistor 108. The driver circuit 100 is then placed in an on state, the power transistor 112 being turned on and sinking a current from the electrical energy source 114, through the load 116, through the power transistor 112, and through the sense resistor 118 to ground. In this regard, the values of resistor 122 and resistors 146 and 154 may be selected high to result in negligible current flow therethrough. When the positive command voltage is turned off, all transistors 102, 108 and 112 are similarly turned off, placing the driver circuit 100 in an off state.

Comparator 134 is utilized to identify an overcurrent condition, which will typically be indicative of a short circuit to the electrical energy source 114. The value of sense resistor 118 and reference voltage +VR2 are selected to result in a change of state at the output terminal of comparator 134 when an overcurrent is detected. Thus, if the typical driving current for load 116 is 2 amperes, an overcurrent detection level of 3 amperes may be selected. Assuming a resistance of 0.2 ohms for sense resistor 118, the appropriate reference voltage +VR2 is then determined to be +0.6 volts. If the driver circuit 100 is off, or is operating at below the overcurrent level, the voltage at the positive input terminal of comparator 134 will be less than the +0.6 volt reference voltage applied to the negative input terminal, and the output terminal of comparator 134 will be connected to ground. If the driver circuit 100 is on and operates at above the overcurrent level, the voltage applied to the positive input terminal of comparator 134 will be greater than the +0.6 volt reference voltage applied to the negative input terminal, and the output terminal of comparator 134 will be open circuited.

Based upon the condition of the output terminal of comparator 134, a voltage is established at the negative input terminal of the comparator 144. If an overcurrent is detected by the comparator 134, the output terminal of comparator 134 is open circuited and the negative input terminal of comparator 144 is pulled high to the +13 volt reference voltage +VR3 through resistor 142. If no overcurrent is detected by the comparator 134, the output terminal of comparator 134 is grounded and the negative input terminal of comparator 144 is pulled to the voltage across resistor 140. Resistors 140 and 142 are thus selected to establish the voltage level at the negative input terminal of comparator 144 during such nonovercurrent operation. If, for example, the resistor 142 is 20 Kohms and the resistor 140 is 5.1 Kohms, the negative input terminal of comparator 144 is pulled to about +2.64 volts when there is no overcurrent detected by the comparator.

The voltage established at the negative input terminal of comparator 144 is compared with the voltage established at the positive input terminal of comparator 144 in order to provide a diagnostic output voltage 160 at the output terminal thereof. Reference voltage +VR4 is selected to set a non-damaging maximum voltage that can be applied to the positive input terminal of comparator 144 and may be +5 volts for example. The reference voltage +VR5 is selected to pull the diagnostic output voltage 160 to a digital high value when the voltage at the positive input terminal of comparator 144 is greater than the voltage at the negative input terminal of comparator 144, and therefore may also be +5 volts.

The various modes of operation of the driver circuit 100 and corresponding diagnostic outputs are now described in view of the foregoing.

During normal operation with the load 116, if the driver circuit 100 is off, no current flows through sense resistor 118 and the voltage established at the negative input terminal of comparator 144 is about +2.64 volts. The voltage at the drain of power transistor 112 is pulled to about +12 volts, the voltage of the electrical energy source 114, through the load 116. This +12 volts is sufficient to force diode 152 to turn on establishing a +5.7 volt level at the positive input terminal of comparator 144. Because the positive input terminal voltage is greater than the negative input terminal voltage, the output terminal of comparator 144 is open circuited and the diagnostic output voltage 160 is pulled high to +5 volts through resistor 158. A high diagnostic output voltage indicates a no fault condition of the driver circuit 100.

During normal operation with the driver circuit 100 in an on condition, the current through sense resistor 118 is only about 2 amperes and therefore the voltage established at the negative input terminal of the comparator 144 is about +2.64 volts. The voltage at the gate of power transistor 112 is about +6.4 volts which is again sufficient to establish +5.7 volts at the positive input terminal of comparator 144. Thus, the output terminal of comparator 144 is open circuited resulting in a high diagnostic output voltage 160, again indicating a no fault condition.

An open circuit fault condition is detected when the driver circuit 100 is off. If the driver circuit 100 is off no current flows through the sense resistor 118 and the voltage established at the negative input terminal of comparator 144 is about +2.64 volts. The voltage at the gate of power transistor 112 is 0 volts when the driver circuit 100 is off. The voltage at the drain of power transistor 112 is also 0 volts because in an open circuit condition the path from the power transistor drain through the load 116 to the electrical energy source 114 is opened. Accordingly, the voltage established at the positive input terminal of comparator 144 is 0 volts. Because the voltage at the negative input terminal of comparator 144 is greater than the voltage at the positive input terminal, the output terminal of comparator 144 is connected to ground and the diagnostic output voltage 160 is pulled low to ground through the comparator 144. This digital low output level indicates a fault condition of the driver circuit 100. Note that if the driver circuit 100 is on during an open circuit, no current flows through sense resistor 118 and the voltage established at the negative input terminal of comparator 144 is about +2.64 volts. However, the voltage at the gate of the power transistor 112 is about +6.4 volts which is sufficient to establish +5.7 volts at the positive input terminal of comparator 144. The output terminal of comparator 144 is therefore open circuited and the diagnostic output voltage 160 is pulled high to +5 volts through resistor 158. Accordingly, the open circuit fault condition is detected when the driver circuit 100 is off.

On the other hand, an overcurrent, which is indicative of a short circuit fault condition, is detected when the driver circuit 100 is on. If the driver circuit 100 is on and a short circuit condition exists, the current through sense resistor 118 will exceed the overcurrent level of 3 amperes and the voltage at the positive input terminal of comparator 134 will be greater than the +0.6 volt reference voltage at the negative input terminal. Accordingly, the output terminal of comparator 134 will be open circuited and the voltage at the negative input terminal of comparator 144 will be pulled to +13 volts through resistor 142. The voltage at the drain of the power transistor 112 will be about +12 volts minus the voltage drop across diode 120, or about +11.5 volts, and the voltage at the gate of power transistor 112 will be about +6.4 volts. These voltages are sufficient to establish a +5.7 volt level at the positive input terminal of comparator 144. Thus, the voltage at the negative input terminal of comparator 144 is greater than the voltage at the positive input terminal of comparator 144, and the output terminal of comparator 144 is connected to ground. The diagnostic output voltage 160 is therefore pulled low to ground through the comparator 144, indicating a fault. If the driver circuit 100 is off during a short circuit condition, no current flows through the sense resistor 118 and therefore the voltage established at the negative input terminal of comparator 144 will be about +2.64 volts. The voltage at the positive input terminal will still be established at +5.7 volts because the drain voltage of the power transistor 112 will still be about +11.5 volts. Because the voltage at the positive input terminal of comparator 144 is then greater than the voltage at the negative input terminal, the diagnostic output voltage 160 is pulled high to +5 volts through resistor 158.

The driver circuit 100 provides a single diagnostic output voltage 160 which can indicate two different fault conditions. Such diagnostic output voltage 160 can be provided to the logic means which controls the command voltage so that, if a low diagnostic output voltage is detected, the driver command voltage can be set to 0 volts to shut off the driver circuit 100. A fault signal can also be sent to other system devices. The nature of the fault condition is easily determined according to the state of the driver circuit 100 when the fault is detected as illustrated by the diagnostic diagram in Table 1 below.

TABLE 1

CIRCUIT DIAGNOSTICS

| DRIVER CIRCUIT CONDITION | DIAGNOSTIC OUTPUT VOLTAGE | INDICATION |
|---|---|---|
| OFF | 0 | OPEN CIRCUIT |
| OFF | 1 | OK |
| ON | 0 | SHORT CIRCUIT |
| ON | 1 | OK |

Thus, according to the present invention, fault conditions of the driver circuit 100 are detected by the following steps:

(a) determining if a current through the power transistor exceeds a predetermined level;

(b) establishing a voltage based upon the determination made in step (a);

(c) sensing a voltage at the power transistor drain;

(d) sensing a voltage at the power transistor gate;

(e) establishing a voltage indicative of at least one of the voltages sensed in steps (c) and (d);

(f) comparing the voltage established in step (b) with the voltage established in step (e); and (g) establishing a diagnostic output voltage based upon the comparison made in step (f). When the voltage established in step (b) is greater than the voltage established in step (c), a digitally low diagnostic output voltage is established at step (g) to indicate a fault. If the driver circuit 100 is off the low diagnostic output is indicative of an open circuit fault condition and if the driver circuit 100 is on the low diagnostic output is indicative of a short circuit fault condition.

Other aspects, objects and advantages of this invention can be obtained from a study of the drawings, the disclosure and the appended claims.

We claim:

1. A driver circuit, comprising:

a command voltage source;

an npn switching transistor having a collector, a base and an emitter, the base connected to the command voltage source, the emitter connected to ground;

a pnp switching transistor having a collector, a base, and an emitter, the base connected to the npn switching transistor collector, the emitter connected to a first reference voltage;

an electrical energy source;

a power transistor having a drain, a source, and a gate, the drain connected to the electrical energy source through a load;

a first resistor connected between the pnp switching transistor collector and the power transistor gate;

a second resistor connected between the power transistor gate and ground;

a sense resistor connected between the power transistor source and ground; and a diagnostic circuit portion connected between the power transistor source and the sense resistor for indicating the occurrence of a fault condition in the driver circuit.

2. A driver circuit, as set forth in claim 1, wherein the diagnostic circuit portion includes:

a first comparator having a positive input terminal, a negative input terminal, an output terminal, and a ground terminal, the negative input terminal connected to a second reference voltage, the positive input terminal connected between the power transistor source and the sense resistor, the ground terminal connected to ground;

a second comparator having a positive input terminal, a negative input terminal, and an output terminal;

a third resistor connected between the power transistor drain and the second comparator positive input terminal;

a first diode connected between the power transistor gate and the second comparator positive input terminal; and a fourth resistor and a fifth resistor connected in series between the first comparator output terminal and a third reference voltage, the second comparator negative input terminal connected between the fourth and fifth resistors.

3. A driver circuit, as set forth in claim 2, wherein the diagnostic circuit portion further includes:

a second diode having an anode terminal and a cathode terminal, the anode terminal connected to the second comparator positive input terminal and the cathode terminal connected to a fourth reference voltage;

a third diode connected between the third resistor and the second comparator positive input terminal; and a sixth resistor connected between the second comparator positive input terminal and ground.

4. A driver circuit, as set forth in claim 3, wherein the first comparator positive input terminal is connected between the power transistor source and the sense resistor through a seventh resistor.

5. A driver circuit, as set forth in claim 4, further comprising:

a fourth diode connected between the load and the power transistor drain;

an eighth resistor having a first side connected between the load and the fourth diode and a second side connected to ground; and a first capacitor connected in parallel with the eighth resistor.

6. A driver circuit, comprising:

an electrical energy source;

a power transistor having a drain, a gate, and a source, the drain connected to the electrical energy source through a load;

a sense resistor connected between the power transistor source and ground;

a first comparator having a positive input terminal, a negative input terminal, and an output terminal, the positive input terminal connected between the power transistor source and the sense resistor, the negative input terminal connected to a first reference voltage; and a second comparator having a positive input terminal, a negative input terminal, and an output terminal, the positive input terminal connected to the power transistor drain through a first diode and to the power transistor gate through a second diode, the negative input terminal connected to the first comparator output terminal.

7. A driver circuit, as set forth in claim 6, further comprising:

a first resistor, a second resistor, and a switching transistor all connected in series between a second reference voltage and ground the first resistor and second resistor being connected in series between the switching transistor and ground, the power transistor gate connected between the first resistor and the second resistor.

8. A driver circuit, as set forth in claim 7, wherein the first comparator is an open collector comparator having a ground terminal connected to ground, the driver circuit further comprising a fifth resistor and a fourth resistor connected in series between the first comparator output terminal and a third reference voltage, the second comparator negative input terminal connected between the fourth resistor and the fifth resistor.

9. A driver circuit, as set forth in claim 7, further comprising a command voltage source, the command voltage source being associated with the switching transistor base for controlling the switching thereof.

10. A driver circuit, as set forth in claim 6, wherein the power transistor is an N-channel MOSFET.

11. A method of detecting a fault condition of a driver circuit including a power transistor having a drain, a gate and a source, the method comprising the steps of:

(a) determining if a current through the power transistor exceeds a predetermined level;

(b) establishing a voltage based upon the determination made in step (a);

(c) sensing a voltage at the power transistor drain;

(d) sensing a voltage at the power transistor gate;

(e) establishing a voltage indicative of at least one of the voltages sensed in steps (c) and (d);

(f) comparing the voltage established in step (b) with the voltage established in step (e); and (g) establishing a diagnostic output voltage based upon the comparison made in-step (f), whereby when the voltage established in step (b) is greater than the voltage established in step (e), the diagnostic output voltage established in step (g) is indicative of a fault condition of the driver circuit.

12. A method, as set forth in claim 11, wherein a fault indicative voltage established in step (g) is indicative of a first fault condition of the driver circuit if the power transistor is on and is indicative of a second fault condition of the driver circuit if the power transistor is off.

13. A method, as set forth in claim 12, wherein the first fault condition is a short circuit condition of the driver circuit and the second fault condition is an open circuit condition of the driver circuit.

14. A method, as set forth in claim 11, wherein step (a) includes:

(i) sensing a voltage at the power transistor source; and (ii) comparing the voltage sensed at step (i) with a predetermined reference voltage.

* * * * *

UNITED STATES PATENT AND TRADEMARK OFFICE
CERTIFICATE OF CORRECTION

PATENT NO. : 5,903,173
DATED : May 11, 1999
INVENTOR(S) : Gottshall et al.

It is certified that error appears in the above-identified patent and that said Letters Patent is hereby corrected as shown below:

Column 8, line 5, insert --,-- after "ground"

Column 8, line 40, delete "-" after in and before step.

Signed and Sealed this

Twenty-second Day of February, 2000

Attest:

Q. TODD DICKINSON

Attesting Officer    Commissioner of Patents and Trademarks